United States Patent
Miyamoto (10) Patent No.: US 7,423,925 B2
(45) Date of Patent: Sep. 9, 2008

(54) MEMORY

(75) Inventor: Hideaki Miyamoto, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 306 days.

(21) Appl. No.: 11/473,083

(22) Filed: Jun. 23, 2006

(65) Prior Publication Data

US 2006/0291314 A1 Dec. 28, 2006

(30) Foreign Application Priority Data

Jun. 23, 2005 (JP) ............................. 2005-182952

(51) Int. Cl.
*G11C 7/00* (2006.01)

(52) U.S. Cl. .................. 365/222; 365/145; 365/149; 365/233.1; 365/233.11; 365/233.12; 711/106

(58) Field of Classification Search ................ 365/222, 365/233.1, 233.11, 233.12, 145, 149; 711/106
See application file for complete search history.

(56) References Cited

U.S. PATENT DOCUMENTS

| | | | |
|---|---|---|---|
| 4,933,907 A * | 6/1990 | Kumanoya et al. .......... 365/222 |
| 5,155,705 A * | 10/1992 | Goto et al. .................. 365/218 |
| 6,285,626 B2 | 9/2001 | Mizuno et al. | |
| 6,421,292 B1 * | 7/2002 | Kitamoto et al. ............ 365/222 |
| 6,469,948 B2 | 10/2002 | Mizuno et al. | |
| 6,501,699 B2 * | 12/2002 | Mizugaki .................... 365/222 |
| 6,597,615 B2 * | 7/2003 | Mizugaki .................... 365/222 |
| 6,665,231 B2 | 12/2003 | Mizuno et al. | |
| 6,885,593 B2 | 4/2005 | Mizuno et al. | |
| 7,362,642 B2 * | 4/2008 | Miyamoto et al. .......... 365/222 |
| 2007/0183242 A1 * | 8/2007 | Miyamoto .................. 365/222 |

FOREIGN PATENT DOCUMENTS

| | | |
|---|---|---|
| JP | 07-073682 A | 3/1995 |
| JP | 2001-229674 A | 8/2001 |

* cited by examiner

*Primary Examiner*—Richard Elms
*Assistant Examiner*—Eric Wendler
(74) *Attorney, Agent, or Firm*—McDermott Will & Emery LLP (57) ABSTRACT

A memory capable of performing a refresh operation uncompetitively with an internal access operation also when an external access operation is non-cyclically performed is obtained. This memory comprises an external access detection portion detecting an external access operation, an access control portion performing an internal access operation on the basis of the external access operation and a refresh determination portion determining whether or not to perform a refresh operation on the basis of detection of the external access operation by the external access detection portion and the operating state of the access control portion. The access control portion performs the refresh operation before or after the internal access operation on the basis of the result of determination of the refresh determination portion.

16 Claims, 3 Drawing Sheets

MEMORY

BACKGROUND OF THE INVENTION

1. Field of the Invention

The present invention relates to a memory, and more particularly, it relates to a memory refreshing stored data.

2. Description of the Background Art

A ferroelectric random access memory (FeRAM) is generally known as an exemplary nonvolatile memory. The ferroelectric memory utilizes pseudo-capacitance change depending on the direction of polarization of a ferroelectric substance as a memory element. A simple matrix ferroelectric memory or a one-transistor ferroelectric memory requiring an operation of refreshing data stored in a memory cell is known as such a ferroelectric memory (refer to Japanese Patent Laying-Open No. 7-73682 (1995), for example). It is known that this simple matrix or one-transistor ferroelectric memory causes the so-called disturbance triggering data loss through reduction in the quantity of polarization of a ferroelectric capacitor resulting from a prescribed voltage applied to a memory cell connected to a word line other than a selected word line in a rewrite operation after a read operation and a write operation on a memory cell including the ferroelectric capacitor. In order to suppress this disturbance, the ferroelectric memory performs a refresh operation. The conventional ferroelectric memory disclosed in the aforementioned Japanese Patent Laying-Open No. 7-73682 counts the frequency of external access operations, for performing a refresh operation when the access frequency reaches a constant number of times.

On the other hand, a technique for performing a refresh operation uncompetitively with an internal access operation is generally proposed in relation to a memory performing the refresh operation (refer to Japanese Patent Laying-Open No. 2001-229674, for example). Japanese Patent Laying-Open No. 2001-229674 discloses a DRAM (dynamic random access memory) performing an internal access operation (read or write operation) in synchronization with an internal clock having a shorter cycle than an external clock having a prescribed cycle. In general, a DRAM must perform a refresh operation after a lapse of a prescribed period. In the DRAM disclosed in Japanese Patent Laying-Open No. 2001-229674, the number of internal clocks generated in a constant period is larger than that of external clocks input in this constant period since the cycle of the internal clock is shorter than that of the external clock. Thus, this DRAM cyclically generates an internal clock also when no external access operation is performed in synchronization with an external clock, to result in periodic generation of an internal clock triggering no internal access operation corresponding to an external access operation. Therefore, the DRAM disclosed in Japanese Patent Laying-Open No. 2001-229674 performs a refresh operation in synchronization with the internal clock triggering no internal access operation.

However, the conventional DRAM disclosed in the aforementioned Japanese Patent Laying-Open No. 2001-229674 renders the cycle of the internal clock for performing the internal access operation shorter than that of the external clock on the premise that the external access operation is cyclically performed in synchronization with the external clock, thereby cyclically generating an internal clock triggering no internal access operation and performing a refresh operation in synchronization with this internal clock triggering no internal access operation. In other words, the technique disclosed in Japanese Patent Laying-Open No. 2001-229674 is applicable to a memory subjected to an external access operation cyclically performed in synchronization with an external clock, since this memory can cyclically generate an internal clock triggering no internal access operation. However, a memory subjected to an non-cyclically performed external access operation cannot cyclically generate an internal clock triggering no internal access operation since the period of the external access operation is not constant. Consequently, the technique of Japanese Patent Laying-Open No. 2001-229674 performing the refresh operation uncompetitively with the internal access operation cannot be applied to a memory subjected to a non-cyclically performed external access operation.

SUMMARY OF THE INVENTION

The present invention has been proposed in order to solve the aforementioned problem, and an object of the present invention is to provide a memory capable of performing a refresh operation uncompetitively with an internal access operation Also when an external access operation is non-cyclically performed.

A memory according to an aspect of the present invention comprises an external access detection portion detecting an external access operation, an access control portion performing an internal access operation on the basis of the external access operation and a refresh determination portion determining whether or not to perform a refresh operation on the basis of detection of the external access operation by the external access detection portion and the operating state of the access control portion, while the access control portion performs the refresh operation before or after the internal access operation on the basis of the result of determination of the refresh determination portion.

The memory according to the aforementioned aspect of the present invention, provided with the refresh determination portion determining whether or not to perform a refresh operation on the basis of detection of the external access operation by the external access detection portion and the operating state of the access control portion as hereinabove described, can determine whether or not to perform a refresh operation upon the external access operation with the refresh determination portion on the basis of the operating state of the access control portion, also when the external access operation is not cyclically performed. Thus, the access control portion can perform the refresh operation uncompetitively with an internal access operation on the basis of the determination of the refresh determination portion, also when the memory is subjected not to a cyclically performed external access operation but to a non-cyclically performed external access operation.

In the memory according to the aforementioned aspect, the refresh determination portion preferably outputs a signal for performing the refresh operation if the access control portion performs neither internal access operation nor refresh operation when the external access detection portion detects the external access operation. According to this structure, the access control portion, having completed an internal access operation corresponding to a precedent external access operation and a refresh operation if performing neither internal access operation nor refresh operation when the external access detection portion detects the external access operation, can start an internal access operation corresponding to the external access operation or a refresh operation substantially simultaneously with the detection of the external access operation. Thus, the access control portion performs the refresh operation when the same can start the internal access operation or the refresh operation substantially simultaneously with the detection of the external access operation, thereby reducing such a possibility that the internal access operation or the refresh operation continues until after the start of a next external access operation. Therefore, the memory can suppress a delay of the starting period for an internal access operation corresponding to the next external access operation or a refresh operation resulting from continuation of the internal access operation or the refresh operation until after the start of the next external access operation.

In this case, the access control portion preferably performs the internal access operation and thereafter continuously performs the refresh operation on the basis of the signal for performing the refresh operation if performing neither internal access operation nor refresh operation when the external access detection portion detects the external access operation. According to this structure, the memory can easily suppress a delay of the starting period for the internal access operation corresponding to the next external access operation or the refresh operation.

In the memory according to the aforementioned aspect, the access control portion preferably performs the internal access operation after completion of the refresh operation if performing the refresh operation when the external access detection portion detects the external access operation. According to this structure, the memory can prevent the access control portion from simultaneously performing the refresh operation and the internal access operation, thereby easily suppressing competition of the refresh operation and the internal access operation.

In the memory according to the aforementioned aspect, the access control portion preferably performs the internal access operation after completion of a precedent internal access operation if performing the precedent internal access operation when the external access detection portion detects the external access operation. According to this structure, the memory can prevent the access control portion from simultaneously performing a plurality of internal access operations, thereby easily suppressing competition of the plurality of internal access operations.

In the memory according to the aforementioned aspect, the access control portion preferably performs the internal access operation and thereafter performs no refresh operation after completion of the internal operation or the refresh operation if performing either the internal access operation or the refresh operation when the external access detection portion detects the external access operation. When the access control portion performs the internal access operation after completion of the internal operation or the refresh operation in this manner, the point of completion of the internal access operation is so retarded that the memory can suppress such inconvenience that the refresh operation continues until after the start of the next external access operation by performing no refresh operation after the internal access operation.

In the memory according to the aforementioned aspect, the period of the internal access operation is preferably shorter than the period of the external access operation. According to this structure, the access control portion performs the internal access operation in the period shorter than that of the external access operation, whereby the memory can suppress a delay of the internal access operation with respect to the external access operation Also when performing the refresh operation.

In the aforementioned memory performing the internal access operation in the period shorter than the period of the external access operation, the access control portion preferably includes a clock generation portion generating an internal clock having a cycle shorter than the period of the external access operation, for performing each of the internal access operation and the refresh operation in one cycle of the internal clock. According to this structure, the access control portion performs each of the internal access operation and the refresh operation within a period shorter than that of the external access operation, whereby the memory can reduce a possibility of delaying the internal access operation with respect to the next external access operation Also when performing the refresh operation. Thus, the memory can suppress a delay of the internal access operation with respect to the next external access operation.

In the aforementioned memory outputting the internal clock, the external access operation is preferably non-cyclically performed, the internal clock preferably includes an internal clock for the internal access operation and an internal clock for the refresh operation, and the access control portion preferably performs the refresh operation in the period of a next external access operation if the period of the external access operation is not less than the sum of the cycle of the internal clock for the internal access operation and the cycle of the internal clock for the refresh operation. According to this structure, the memory, completing the internal access operation and the refresh operation within the period of the external access operation not less than the sum of the cycle of the internal clock for the internal access operation and that of the internal clock for the refresh operation when performing the internal access operation substantially from the first stage of this period, can start the internal access operation or the refresh operation substantially simultaneously with detection of a next external access operation. Thus, the memory can reduce a possibility of delaying the internal access operation with respect to an external access operation subsequent to the next external operation Also when performing the refresh operation in the period of the next external operation, thereby suppressing a delay of the internal access operation with respect to the external access operation subsequent to the next external access operation.

In the aforementioned memory outputting the internal clock, the external access operation may be cyclically performed, the internal clock may include an internal clock for the internal access operation and an internal clock for the refresh operation, and the period of the external access operation may be shorter than the sum of the cycle of the internal clock for the internal access operation and the cycle of the internal clock for the refresh operation. In this case, the access control portion performs the refresh operation once every plurality of internal access operations.

The memory according to the aforementioned aspect preferably further comprises an external access counting portion counting the access frequency of the external access operation, while the access control portion preferably performs the refresh operation on the basis of the result of determination of the refresh determination portion and the access frequency counted by the external access counting portion. According to this structure, the access control portion can perform the refresh operation when the external access operation is performed by a constant frequency, thereby performing a refresh operation suitable for a ferroelectric memory or the like deteriorating data through a constant frequency of external access operations.

In the memory according to the aforementioned aspect, the internal access operation preferably includes a data read operation and a data rewrite operation As well as a data write operation, and the refresh operation preferably includes a data read operation and a data rewrite operation. According to this structure, the access control portion can perform the refresh operation similarly to the internal access operation, thereby simplifying control of the refresh operation.

The memory according to the aforementioned aspect preferably further comprises a word line and a bit line arranged to intersect with each other and a memory cell arranged to be linked to at least the word line, while the access control portion preferably collectively performs the refresh operation every word line on the memory cell linked to the word line. According to this structure, the memory can reduce the frequency of the refresh operation as compared with a case of performing the refresh operation one by one for each memory cell.

The memory according to the aforementioned aspect may further comprise a word line and a bit line arranged to intersect with each other and a ferroelectric capacitor arranged between the word line and the bit line.

The memory according to the aforementioned aspect preferably further comprises a switching portion switching a row address signal corresponding to an internal address signal for performing the internal access operation and another row address signal corresponding to a refresh address signal for performing the refresh operation. According to this structure, the memory can easily switch the row address signal for the internal access operation and the row address signal for the refresh operation with the switching portion and supply the switched row address signal to the row decoder.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings. Each of the following embodiments is described with reference to a simple matrix ferroelectric memory, having memory cells each constituted of only a ferroelectric capacitor arranged on an intersectional position between a word line and a bit line, employed as an exemplary memory according to the present invention.

First Embodiment

Figure 1:
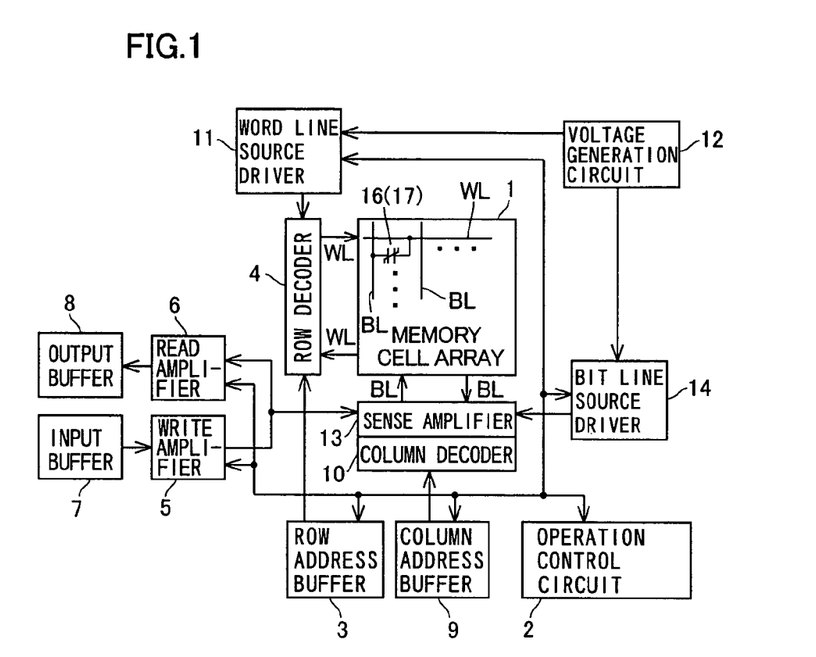
FIG. 1 is a block diagram showing the overall structure of a simple matrix ferroelectric memory according to a first embodiment of the present invention.

The structure of a simple matrix ferroelectric memory according to a first embodiment of the present invention is described with reference to FIGS. 1 to 3.

The simple matrix ferroelectric memory according to the first embodiment comprises a memory cell array 1, an operation control circuit 2, a row address buffer 3, a row decoder 4, a write amplifier 5, a read amplifier 6, an input buffer 7, an output butter 8, a column address buffer 9, a column decoder 10, a word line source driver 11, a voltage generation circuit 12, a sense amplifier 13 and a bit line source driver 14.

Figure 2:
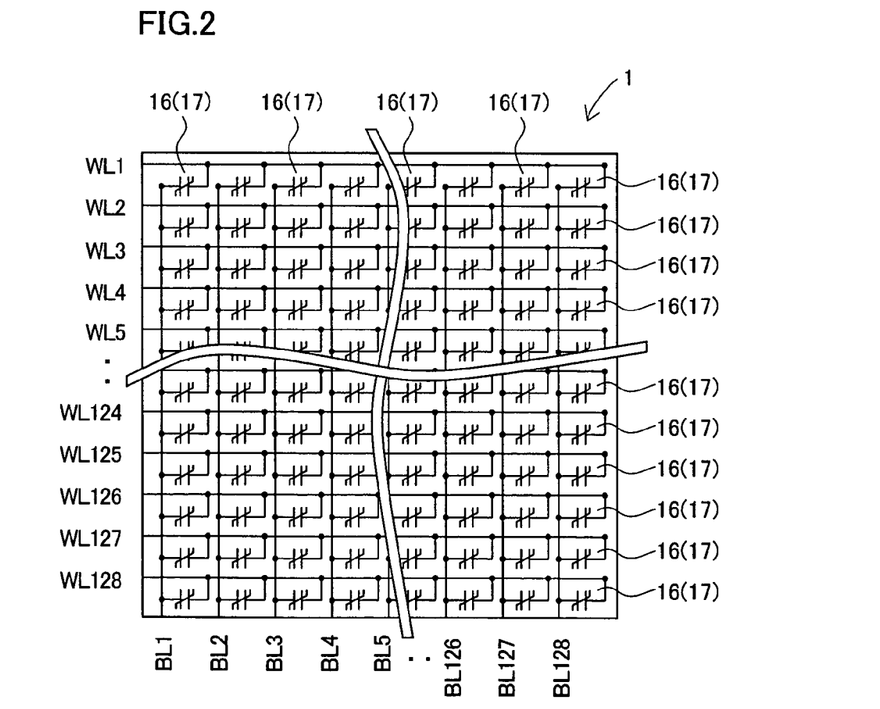
FIG. 2 is a schematic diagram for illustrating the structure of a memory cell array of the simple matrix ferroelectric memory according to the first embodiment shown in FIG. 1.

As shown in FIG. 2, 128 word lines WL and 128 bit lines BL, for example, are arranged on the memory cell array 1 to intersect with each other, while memory cells 17 consisting of only single ferroelectric capacitors 16 are arranged on the intersectional positions between the word lines WL and the bit lines BL respectively. Each ferroelectric capacitor 16 includes the corresponding word line WL, the corresponding bit line BL and a ferroelectric film (not shown) arranged between the word line WL and the bit line BL. The row decoder 4 is connected to the word lines WL. The row address buffer 3 is connected to the row decoder 4.

According to the first embodiment, the operation control circuit 2 is provided for controlling an internal data access operation and a data refresh operation with respect to the memory cells 17. This operation control circuit 2 includes an external access detection circuit 20, an access counting circuit (counter) 21, a refresh control circuit 22, a refresh determination circuit 23 and an access control circuit 25 having an internal clock generation circuit 24. The external access detection circuit 20 is an example of the "external access detection portion" in the present invention, the refresh determination circuit 23 is an example of the "refresh determination portion" in the present invention, and the access control circuit 25 is an example of the "access control portion" in the present invention.

The external access detection circuit 20 has a function of outputting an external access detection pulse ATD to the access counting circuit 21, the refresh determination circuit 23 and the access control circuit 25 when receiving an external address signal through an external access operation.

The access counting circuit 21, which is reset upon power supply, has a function of counting up an external access frequency by +1 every time the external access detection pulse ATD is received from the external access detection circuit 20 and outputting the external access frequency to the refresh control circuit 22. The refresh control circuit 22 has a function of outputting a refresh request signal to the access control circuit 25 when the external access frequency reaches a constant number of times ($10^8$ times, for example), in order to require a refresh operation of the memory cell array 1. The refresh control circuit 22 also has a function of outputting a refresh address signal for the refresh operation to the row address buffer 3 when receiving a refresh operation signal from the access control circuit 25.

The refresh determination circuit 23 is so formed as to output a refresh determination signal RefE of a high or low level on the basis of the operating state of the access control circuit 25 when supplied with the external access detection pulse ATD from the external access detection circuit 20 detecting an external access operation.

The access control circuit 25 has a function of generating an internal clock ICLK for an internal access operation corresponding to the detected external access operation with the internal clock generation circuit 24 if performing neither internal access operation nor refresh operation when receiving the external access detection pulse ATD from the external access detection circuit 20. This internal clock ICLK has a cycle (50 nsec, for example) shorter than the shortest cycle (80 nsec, for example) of the external access operation and longer than at least a time for completing the internal access operation. The access control circuit 25 also has a function of generating an internal access operation signal for the internal access operation and outputting the same to the read amplifier 6 and the write amplifier 5, while outputting a row address signal and a column address signal of an internal address signal for the internal access operation to the row address buffer 3 and the column address buffer 9 respectively. The access control circuit 25 further has a function of outputting a refresh operation signal to the refresh control circuit 22 when the refresh control circuit 22 outputs the refresh request signal upon completion of the internal access operation and the refresh determination signal RefE output from the refresh determination circuit 23 is at a high level.

The row address buffer 3 is provided for supplying the row address signal of the internal address signal received from the access control circuit 25 and a prescribed row address signal corresponding to the refresh address signal received from the refresh control circuit 22. The row decoder 4 is so formed as to activate a word line WL corresponding to the prescribed row address signal supplied from the row address buffer 3 in each of the internal access operation and the refresh operation. This row address buffer 3 includes a switching circuit 26. Thus, the row address buffer 3 can switch the row address signal corresponding to the internal address signal for the internal access operation and the row address signal corresponding to the refresh address signal for the refresh operation with the switching circuit 26 for supplying the same to the row decoder 4.

The input buffer 7 and the output buffer 8 are connected to the write amplifier 5 and the read amplifier 6 respectively. The column decoder 10 is connected to the column address buffer 9. The word line source driver 11 is connected to the row decoder 4. The voltage generation circuit 12 is connected to the word line source driver 11, which in turn is connected to the operation control circuit 2. The column decoder 10 is connected to the bit lines BL of the memory cell array 1 through the sense amplifier 13. The write amplifier 5, the read amplifier 6 and the bit line source driver 14 are connected to the sense amplifier 13, while the voltage generation circuit 12 is connected to the bit line source driver 14.

Figure 3:
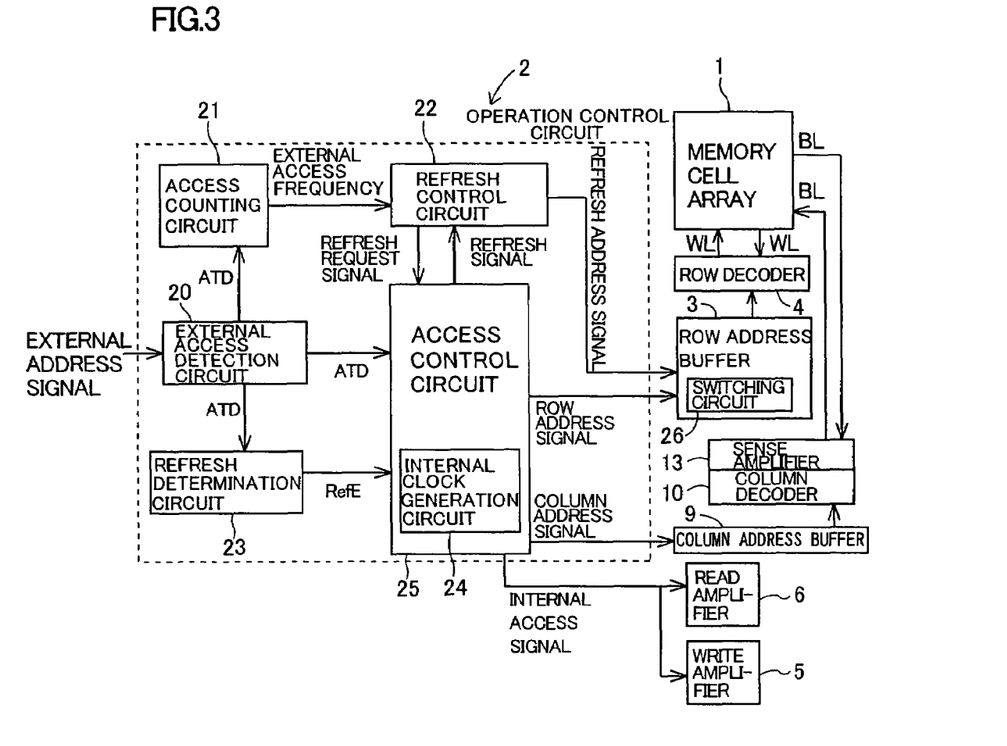
FIG. 3 is a block diagram for illustrating the structure of an operation control circuit of the simple matrix ferroelectric memory according to the first embodiment shown in FIG. 1.
Figure 4:
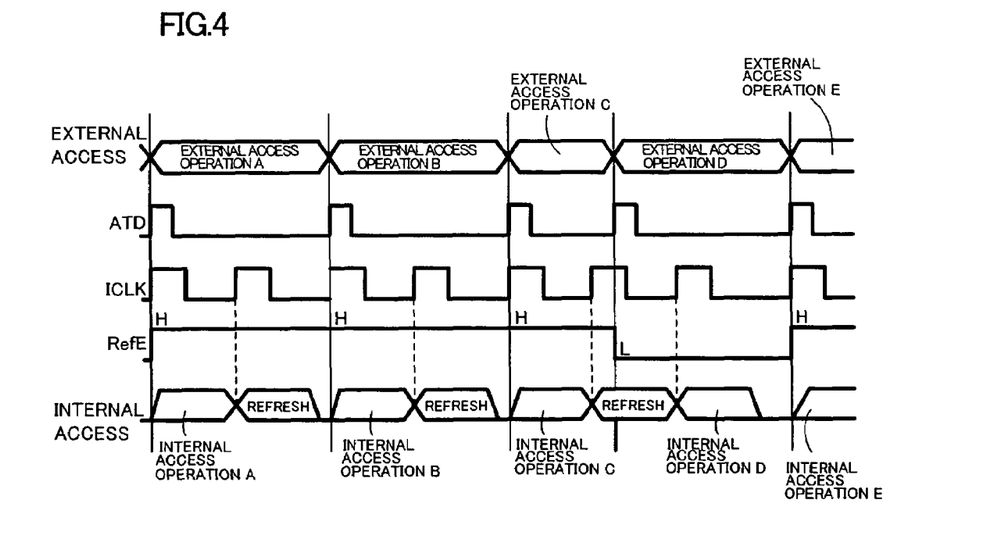
FIG. 4 is a voltage waveform diagram for illustrating operations of the simple matrix ferroelectric memory according to the first embodiment of the present invention.

FIG. 4 is a voltage waveform diagram for illustrating operations of the simple matrix ferroelectric memory according to the first embodiment of the present invention. The operations of the ferroelectric memory according to the first embodiment of the present invention are now described with reference to FIGS. 1 to 4. In the following description, it is assumed that the external access frequency counted by the access counting circuit 21 has reached a prescribed number of times ($10^6$ times, for example) allowing suppression of data disturbance through refreshment in a precedent external access operation in advance of an external access operation A shown in FIG. 4 and the refresh control circuit 22 outputs a refresh request signal to the access control circuit 25.

When detecting an external address signal for the external access operation A, the external address detection circuit 20 generates an external access detection pulse ATD and supplies this external access detection pulse ATD to the access counting circuit 21, the refresh determination circuit 23 and the access control circuit 25, as shown in FIGS. 3 and 4. When supplied with the external access detection pulse ATD upon detection of the external access operation A, the access counting circuit 21 counts up the external access frequency by +1 and supplies data of the external access frequency to the refresh control circuit 22. When supplied with the external access detection pulse ATD upon detection of the external access operation A, the refresh determination circuit 23 determines whether the access control circuit 25 performs an internal access operation or a refresh operation.

When the access control circuit 25 supplied with the external access detection pulse ATD performs neither internal access operation nor refresh operation, the refresh determination circuit 23 sets the refresh determination signal RefE to a high level, in order to authorize the access control circuit 25 to perform the refresh operation during the period of the external access operation A. When the access control circuit 25 supplied with the external access detection pulse ATD from the external access detection circuit 20 performs either the internal access operation or the refresh operation, on the other hand, there is a high possibility that an internal access operation corresponding to a next external access operation B remarkably delays with respect to the external access operation A if the access control circuit 25 performs a refresh operation during the period of the external access operation A. Therefore, the refresh determination circuit 23 sets the refresh determination signal RefE to a low level, so that the access control circuit 25 performs no refresh operation during the period of the external access operation A.

Since the access control circuit 25 performs neither internal access operation nor refresh operation when the external access detection circuit 20 detects the external access operation A, the refresh determination circuit 23 sets the refresh determination signal RefE to a high level. The refresh determination signal RefE remains at the high level until the external access detection circuit 20 detects the next external access operation B.

The access control circuit 25, performing neither internal access operation nor refresh operation when supplied with the external access detection pulse ATD upon detection of the external access operation A, generates the internal clock ICLK having the cycle (50 nsec, for example) shorter than the shortest cycle (80 nsec, for example) of the external access operation for one cycle with the internal clock generation circuit 24. Then, the access control circuit 25 performs an internal access operation A within this cycle of the internal clock ICLK. In this internal access operation A, the access control circuit 25 supplies the row address signal of the internal address signal to the row address buffer 3, which in turn supplies this row address signal of the internal address signal to the row decoder 4. In the internal access operation A, the access control circuit 25 supplies the column address signal of the internal access signal to the column address buffer 9, which in turn supplies this column address signal of the internal address signal to the column decoder 10.

The row decoder 4 activates the word line WL corresponding to the supplied internal address signal, so that the access control circuit 25 performs the internal access operation A (read or write operation) on the memory cells 17 linked to the activated word line WL through the corresponding bit lines BL. In the read operation of the internal access operation A, the access control circuit 25 collectively reads data stored in all memory cells 17 linked to the activated word line WL through the corresponding bit lines BL, and thereafter reads data stored in the memory cells 17 corresponding to the column address signal with the column decoder 10. The data are destroyed in the memory cells 17 in this read operation, and hence the access control circuit 25 thereafter performs a rewrite operation. In this rewrite operation, the access control circuit 25 amplifies the voltages of the read data with the sense amplifier 13 and applies the amplified voltages to the ferroelectric capacitors 16 of the memory cells 17 from which the data have been read through the corresponding bit lines BL, thereby rewriting the data. In the write operation of the internal access operation A, on the other hand, the access control circuit 25 writes data in the memory cell 17 corresponding to the column address signal among those linked to the activated word line WL through the corresponding bit line BL.

When the access control circuit 25 completes the internal access operation A within the cycle of the internal clock ICLK, the refresh determination signal RefE still remains at the high level. The refresh control circuit 22 supplies the refresh request signal to the access control circuit 25. Thus, the access control circuit 25 generates another internal clock ICLK for a refresh operation for one cycle with the internal clock generation circuit 24 and supplies a refresh operation signal to the refresh control circuit 22, thereby entering a refresh operation state. The refresh control circuit 22 supplied with the refresh operation signal supplies a refresh address signal to the row address buffer 3. The access control circuit 25 performs the refresh operation similarly to the read and rewrite operations in the internal access operation A. In other words, the row decoder 4 activates a word line WL (word line WL1 (see FIG. 2), for example) corresponding to the refresh address signal so that the access control circuit 25 collectively reads data stored in all memory cells 17 linked to this word line WL and amplifies the voltages of the read data with the sense amplifier 13. Then, the access control circuit 25 applies the amplified voltages to the ferroelectric capacitors 16 of the memory cells 17 from which the data have been read through the corresponding bit lines BL, thereby rewriting the data. Thus, the access control circuit 25 refreshes the data stored in the memory cells 17. Then, the refresh control circuit 22 counts up the refresh address signal by +1. After completing the refresh operation, the access control circuit 25 enters a standby state until the start of the next external access operation B.

When the external access operation B is started, the external access detection circuit 20 detects an external address signal corresponding thereto. Thus, the external access detection circuit 20 generates an external access detection pulse ATD, and supplies this external access detection pulse ATD to the access counting circuit 21, the refresh determination circuit 23 and the access control circuit 25. When supplied with the external access detection pulse ATD upon detection of the external access operation B, the access counting circuit 21 counts up the external access frequency by +1 and supplies data of the external access frequency to the refresh control circuit 22. When supplied with the external access detection pulse ATD upon detection of the external access operation B, the refresh determination circuit 23 determines whether the access control circuit 25 performs an internal access operation or a refresh operation. Since the access control circuit 25 performs neither internal access operation nor refresh operation when the external access detection circuit 20 detects the external access operation B, the refresh determination circuit 23 holds the refresh determination signal RefE at the high level.

The access control circuit 25, performing neither internal access operation nor refresh operation when supplied with the external access detection pulse ATD upon detection of the external access operation B, generates the internal clock ICLK for one cycle with the internal clock generation circuit 24. Then, the access control circuit 25 performs the internal access operation B within this cycle of the internal clock ICLK. When completing the internal access operation B, the access control circuit 25 generates an internal clock ICLK for one cycle and supplies a refresh operation signal to the refresh control circuit 22 since the refresh determination signal RefE is at the high level. Then, the refresh control circuit 22 supplies a refresh address signal obtained by counting up the refresh address signal for the external access operation A by +1 to the row address buffer 3. Thus, the access control circuit 25 collectively refreshes the memory cells 17 linked to the word line WL (word line WL2 (see FIG. 2), for example) corresponding to the refresh address signal. Then, the refresh control circuit 22 counts up the refresh address signal by +1.

When an external access operation C is started, the external access detection circuit 20 detects an external address signal corresponding thereto. Thus, the external access detection circuit 20 generates an external access detection pulse ATD, and supplies this external access detection pulse ATD to the access counting circuit 21, the refresh determination circuit 23 and the access control circuit 25. When supplied with the external access detection pulse ATD upon detection of the external access operation C, the access counting circuit 21 counts up the external access frequency by +1 and supplies data of the external access frequency to the refresh control circuit 22. When supplied with the external access detection pulse ATD upon detection of the external access operation C, the refresh determination circuit 23 determines whether the access control circuit 25 performs an internal access operation or a refresh operation. Since the access control circuit 25 performs neither internal access operation nor refresh operation when the external access detection circuit 20 detects the external access operation C, the refresh determination circuit 23 holds the refresh determination signal RefE at the high level.

The access control circuit 25, performing neither internal access operation nor refresh operation when supplied with the external access detection pulse ATD upon detection of the external access operation C, generates the internal clock ICLK for one cycle with the internal clock generation circuit 24. Then, the access control circuit 25 performs an internal access operation C within this cycle of the internal clock ICLK. When completing the internal access operation C, the access control circuit 25 generates an internal clock ICLK for one cycle and supplies a refresh operation signal to the refresh control circuit 22 since the refresh determination signal RefE is at the high level. Then, the refresh control circuit 22 supplies a refresh address signal obtained by counting up the refresh address signal for the external access operation B by +1 to the row address buffer 3. Thus, the access control circuit 25 collectively refreshes the memory cells 17 linked to the word line WL (word line WL3 (see FIG. 2), for example) corresponding to the refresh address signal.

When an external access operation D is started, the external access detection circuit 20 detects an external address signal corresponding thereto. Thus, the external access detection circuit 20 generates an external access detection pulse ATD, and supplies this external access detection pulse ATD to the access counting circuit 21, the refresh determination circuit 23 and the access control circuit 25. When supplied with the external access detection pulse ATD, the access counting circuit 21 counts up the external access frequency by +1 and supplies data of the external access frequency to the refresh control circuit 22. When supplied with the external access detection pulse ATD upon detection of the external access operation D, the refresh determination circuit 23 determines whether the access control circuit 25 performs an internal access operation or a refresh operation. Since the access control circuit 25 performs the refresh operation when the external access detection circuit 20 detects the external access operation D, the refresh determination circuit 23 brings the refresh determination signal RefE into a low level.

The access control circuit 25 supplied with the external access detection pulse ATD upon detection of the external access operation D has not yet completed the refresh operation started in the period of the precedent external access operation C. Thus, the access control circuit 25 generates no internal clock ICLK, to perform no internal access operation D. When completing the refresh operation started in the period of the external access operation C, the access control circuit 25 generates an internal clock ICLK for one cycle and starts an internal access operation D. Then, the access control circuit 25 enters an internal access operation state for one cycle. The access control circuit 25 entering the internal access operation state supplies row and column address signals of an internal address signal to the row address buffer 3 and the column address buffer 9 respectively. The row address buffer 3 and the column address buffer 9 supply the row and column address signals to the row decoder 4 and the column decoder 10 respectively. The access control circuit 25 performs a read or write operation on the memory cell 17 corresponding to the internal address signal. According to the first embodiment, the refresh determination signal RefE still remains at the low level when the access control circuit 25 completes the internal access operation D within the cycle of the internal clock ICLK, whereby the access control circuit 25 enters a standby state without performing a refresh operation.

When an external access operation E is started, the external access detection circuit 20 detects an external address signal corresponding thereto. Thus, the external access detection circuit 20 generates an external access detection pulse ATD, and supplies this external access detection pulse ATD to the access counting circuit 21, the refresh determination circuit 23 and the access control circuit 25. Then, the access counting circuit 21 counts up the external access frequency by +1 and supplies data of the external access frequency to the refresh control circuit 22. Since the access control circuit 25 performs neither internal access operation nor refresh operation when the external access detection circuit 20 detects the external access operation E, the refresh determination circuit 23 sets the refresh determination signal RefE to a high level. The access control circuit 25, performing neither internal access operation nor refresh operation, performs an internal access operation E. When completing the internal access operation E, the access control circuit 25 supplies a refresh operation signal to the refresh control circuit 22 since the refresh determination signal RefE is at the high level. Then, the refresh control circuit 22 supplies a refresh address signal obtained by counting up the refresh address signal for the external access operation D by +1 to the row address buffer 3. Thus, the access control circuit 25 collectively refreshes the memory cells 17 linked to the word line WL (word line WL4 (see FIG. 2), for example) corresponding to the refresh address signal.

The access control circuit 25 repeats the refresh operation similarly to the above until the same refreshes all of the 128 word lines WL1 to WL128 shown in FIG. 2. The access control circuit 25 completes the refresh operation by refreshing all word lines WL1 to WL128. Thereafter the access control circuit 25 repeats only the internal access operation. When the external access operation has been performed by a prescribed number of times ($10^6$ times, for example) from the external access operation A, the refresh control circuit 22 supplies a refresh request signal to the access control circuit 25 on the basis of the external access frequency received from the access counting circuit 22. Then, the access control circuit 25 refreshes all word lines WL1 to WL128 again similarly to the above.

According to the first embodiment, as hereinabove described, the external access detection circuit 20 supplies an external access detection pulse ATD when detecting an external access operation. The refresh determination circuit 23 receiving the external access detection pulse ATD sets the refresh determination signal RefE to a high level when the access control circuit 25 performs neither internal access operation nor refresh operation upon detection of the external access operation. The access control circuit 25 is so formed as to perform a refresh operation if the refresh determination signal RefE remains at the high level upon completion of an internal access operation. Also in the ferroelectric memory according to the first embodiment not subjected to a cyclic external access operation, therefore, the refresh determination circuit 23 can determine whether or not to perform a refresh operation upon an external access operation on the basis of the operating state of the access control circuit 25. Consequently, the access control circuit 25 can perform a refresh operation uncompetitively with an internal access operation after the internal access operation on the basis of the determination of the refresh determination circuit 23.

According to the first embodiment, further, the access control circuit 25, having completed an internal access operation corresponding to a precedent external access operation and a refresh operation if performing neither internal access operation nor refresh operation when the external access detection circuit 20 detects the external access operation, can start a subsequent internal access operation substantially simultaneously with the detection of the external access operation. The access control circuit 25 performs a refresh operation only when the external access operation and the internal access operation are substantially simultaneously performable. Thus, the ferroelectric memory can suppress such a possibility that the refresh operation continues until after the start of a next external access operation. Consequently, the ferroelectric memory can suppress a delay of the starting period for an internal access operation for the next external access operation corresponding to the next external access operation resulting from continuation of the refresh operation, performed following the internal access operation, until after the start of the next external access operation. Further, the ferroelectric memory renders the period of the internal clock ICLK shorter than the shortest period of the external clock ECLK so that the access control circuit 25 performs each of the internal access operation and the refresh operation within the cycle of the internal clock ICLK, thereby reducing such a possibility that the internal access operation delays with respect to the external access operation and suppressing a delay of the internal access operation with respect to the external access operation. In addition, the refresh control circuit 22 outputs the refresh request signal only when the external access frequency counted by the access counting circuit 21 reaches the prescribed number of times. Thus, the access control circuit 25 can perform a refresh operation only when the external access frequency reaches the prescribed number of times, thereby performing a refresh operation suitable to the ferroelectric memory causing deterioration of data through a constant frequency of external access operations.

Second Embodiment

Figure 5:
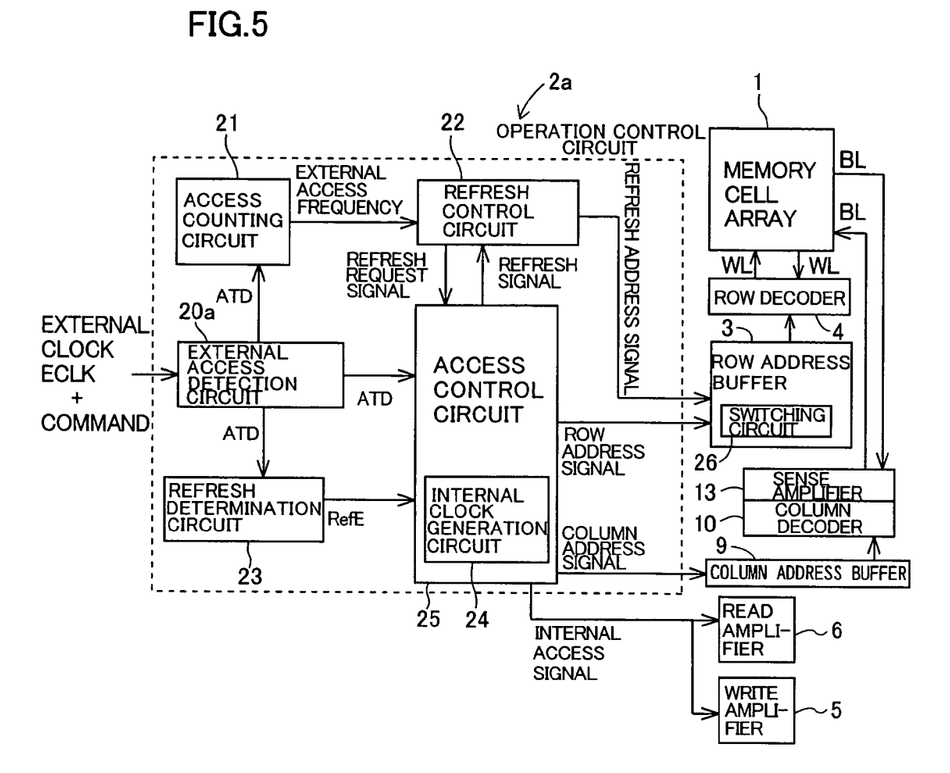
FIG. 5 is a block diagram for illustrating the structure of an operation control circuit of a simple matrix ferroelectric memory according to a second embodiment of the present invention.

Referring to FIG. 5, a second embodiment of the present invention is applied to a simple matrix ferroelectric memory subjected to an external access operation performed in synchronization with an external clock, dissimilarly to the aforementioned first embodiment.

In the ferroelectric memory according to the second embodiment, an operation control circuit 2*a* includes an external access detection circuit 20*a*, an access counting circuit (counter) 21, a refresh control circuit 22, a refresh determination circuit 23 and an access control circuit 25 having an internal clock generation circuit 24, as show in FIG. 5. When an external access operation is performed, the external access detection circuit 20*a* is supplied with an external clock ECLK as well as a command. This command includes an external address signal etc. When supplied with the external clock ECLK, the external access detection circuit 20*a* outputs an external access detection pulse ATD to the access counting circuit 21, the refresh determination circuit 23 and the access control circuit 25. The access counting circuit (counter) 21, the refresh control circuit 22, the refresh determination circuit 23 and the access control circuit 25 are similar in structure to those in the first embodiment. It is assumed that the cycle (50 nsec, for example) of the external clock ECLK is longer than the cycle (40 nsec, for example) of an internal clock ICLK.

The remaining structure of the second embodiment is similar to that of the aforementioned first embodiment.

Figure 6:
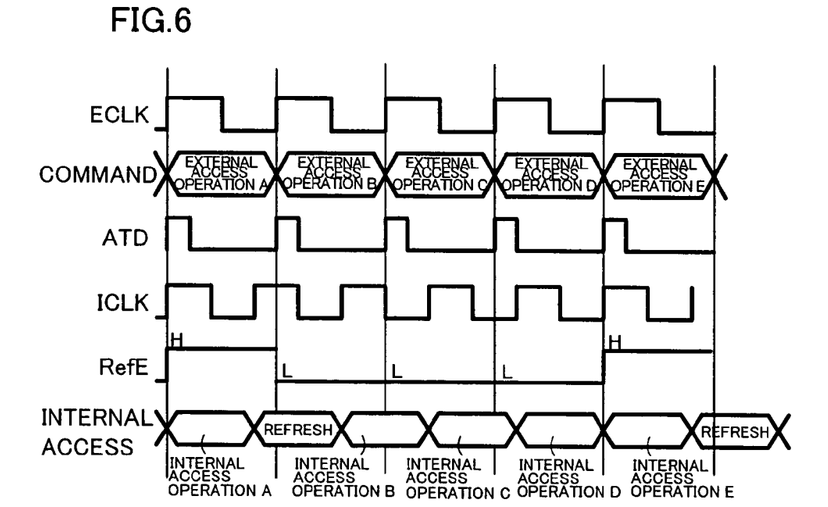
FIG. 6 is a voltage waveform diagram for illustrating operations of the simple matrix ferroelectric memory according to the second embodiment of the present invention.

FIG. 6 is a voltage waveform diagram for illustrating operations of the simple matrix ferroelectric memory according to the second embodiment of the present invention. The operations of the simple matrix ferroelectric memory according to the second embodiment of the present invention are now described with reference to FIGS. 5 and 6. In the following description, it is assumed that an external access frequency counted by the access counting circuit 21 reaches a prescribed number of times ($10^6$ times, for example) allowing suppression of data disturbance through refreshment and the refresh control circuit 22 outputs a refresh request signal to the access control circuit 25 in a precedent external access operation in advance of an external access operation A shown in FIG. 6.

When the external access operation A is started, the external address detection circuit 20*a* is supplied with an external clock ECLK and a command, including an external address signal etc., synchronous with the external clock ECLK, as shown in FIGS. 5 and 6. The external address detection circuit 20*a* detects the external clock ECLK for the external access operation A. Thus, the external access detection circuit 20*a* generates an external access detection pulse ATD, and supplies this external access detection pulse ATD to the access counting circuit 21, the refresh determination circuit 23 and the access control circuit 25. When supplied with the external access detection pulse ATD upon detection of the external access operation A, the access counting circuit 21 counts up the external access frequency by +1 and supplies data of the external access frequency to the refresh control circuit 22. When supplied with the external access detection pulse ATD upon detection of the external access operation A, the refresh determination circuit 23 determines whether the access control circuit 25 performs an internal access operation or a refresh operation. Since the access control circuit 25 performs neither internal access operation nor refresh operation upon detection of the external access operation A, the refresh determination circuit 23 sets a refresh determination signal RefE to a high level.

The access control circuit 25, performing neither internal access operation nor refresh operation when supplied with the external access detection pulse ATD upon detection of the external access operation A, generates an internal clock ICLK having a cycle (40 nsec, for example) shorter than the cycle (50 nsec, for example) of the external clock ECLK for one cycle, and performs an internal access operation A.

When the access control circuit 25 completes the internal access operation A within the cycle of the internal clock ICLK, the refresh control circuit 22 supplies a refresh request signal while the refresh determination signal RefE remains at the high level. Thus, the access control circuit 25 generates another internal clock ICLK for one cycle and supplies a refresh operation signal to the refresh control circuit 22, thereby entering a refresh operation state.

When an external access operation B is started, the external access detection circuit 20*a* detects an external clock ECLK corresponding thereto. Thus, the external access detection circuit 20*a* generates an external access detection pulse ATD, and supplies this external access detection pulse ATD to the access counting circuit 21, the refresh determination circuit 23 and the access control circuit 25. When supplied with the external access detection pulse ATD upon detection of the external access operation B, the access counting circuit 21 counts up the external access frequency by +1 and supplies data of the external access frequency to the refresh control circuit 22. When supplied with the external access detection pulse ATD upon detection of the external access operation B, the refresh determination circuit 23 brings the refresh determination signal RefE into a low level since the access control circuit 25 is in the refresh operation state.

The access control circuit 25, performing the refresh operation when supplied with the external access detection pulse ATD upon detection of the external access operation B, waits without starting an internal access operation B. When completing the refresh operation having been started during the period of the external access operation A, the access control circuit 25 generates an internal clock ICLK for one cycle and starts the internal access operation B.

When an external access operation C is started, the external access detection circuit 20*a* detects an external clock ECLK corresponding thereto. Thus, the external access detection circuit 20*a* generates an external access detection pulse ATD, and supplies this external access detection pulse ATD to the access counting circuit 21, the refresh determination circuit 23 and the access control circuit 25. When supplied with the external access detection pulse ATD upon detection of the external access operation C, the access counting circuit 21 counts up the external access frequency by +1 and supplies data of the external access frequency to the refresh control circuit 22. When supplied with the external access detection pulse ATD upon detection of the external access operation C, the refresh determination circuit 23 holds the refresh determination signal RefE at the low level since the access control circuit 25 continues the internal access operation B.

When supplied with the external access detection pulse ATD upon detection of the external access operation C, the access control circuit 25 continuing the internal access operation B waits without starting an internal access operation C. When completing the internal access operation B, the access control circuit 25 generates an internal clock ICLK for one cycle and starts the internal access operation C without performing a refresh operation since the refresh determination signal RefE is at the low level.

When an external access operation D is started, the external access detection circuit 20*a* detects an external clock ECLK corresponding thereto. Thus, the external access detection circuit 20*a* generates an external access detection pulse ATD, and supplies this external access detection pulse ATD to the access counting circuit 21, the refresh determination circuit 23 and the access control circuit 25. When supplied with the external access detection pulse ATD upon detection of the external access operation D, the access counting circuit 21 counts up the external access frequency by +1 and supplies data of the external access frequency to the refresh control circuit 22. When supplied with the external access detection pulse ATD upon detection of the external access operation D, the refresh determination circuit 23 holds the refresh determination signal RefE at the low level since the access control circuit 25 continues the internal access operation C.

When supplied with the external access detection pulse ATD upon detection of the external access operation D, the access control circuit 25 continuing the internal access operation C waits without starting an internal access operation D. When completing the internal access operation C, the access control circuit 25 generates an internal clock ICLK for one cycle and starts the internal access operation D without performing a refresh operation since the refresh determination signal RefE is at the low level. The access control circuit 25 completes the internal access operation D within the cycle of the internal clock ICLK. When completing the internal access operation D, the access control circuit 25 performs no refresh operation since the refresh determination signal RefE is at the low level.

When an external access operation E is started, the external access detection circuit 20a detects an external clock ECLK corresponding thereto. Thus, the external access detection circuit 20a generates an external access detection pulse ATD, and supplies this external access detection pulse ATD to the access counting circuit 21, the refresh determination circuit 23 and the access control circuit 25. When supplied with the external access detection pulse ATD upon detection of the external access operation E, the access counting circuit 21 counts up the external access frequency by +1 and supplies data of the external access frequency to the refresh control circuit 22. When supplied with the external access detection pulse ATD upon detection of the external access operation E, the refresh determination circuit 23 sets the refresh determination signal RefE to a high level since the access control circuit 25 performs neither internal access operation nor refresh operation.

When supplied with the external access detection pulse ATD upon detection of the external access operation E, the access control circuit 25 performing neither internal access operation nor refresh operation generates an internal clock ICLK for one cycle and starts an internal access operation E. When completing the internal access operation E within the cycle of the internal clock ICLK, the access control circuit 25 generates an internal clock ICLK for one cycle and performs a refresh operation since the refresh determination signal RefE is at the high level.

The access control circuit 25 repeats the refresh operation similarly to the above until the same refreshes all of 128 word lines WL1 to WL128 and thereafter completes the refresh operation, similarly to the first embodiment. When the external access operation has been performed by a prescribed number of times ($10^6$ times, for example) from the external access operation A, the access control circuit 25 starts the refresh operation Again.

According to the second embodiment, as hereinabove described, the present invention is also applicable to a memory subjected to an external access operation cyclically performed in synchronization with the external clock ECLK. The remaining effects of the second embodiment are similar to those of the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the ferroelectric memory performs the refresh operation after completing the internal access operation in each of the aforementioned first and second embodiments, the present invention is not restricted to this but the memory may alternatively perform the refresh operation in advance of the internal access operation.

While the ferroelectric memory performs the refresh operation only once during the period of the external access operation in the aforementioned first embodiment, the present invention is not restricted to this but the memory may alternatively perform the refresh operation A plurality of times during the period of the external access operation if this period is long. More specifically, the memory may perform a refresh operation if no next external access operation is performed upon completion of the refresh operation. According to this structure, the memory can quickly refresh all word lines.

While the ferroelectric memory is supplied with the external address signal for the external access operation in each of the aforementioned first and second embodiments, the present invention is not restricted to this but may alternatively be applied to a memory subjected to an external access operation supplying data other than an external address signal to an external access detection circuit as a command.

While the ferroelectric memory collectively refreshes all memory cells linked to the selected word line in each of the aforementioned first and second embodiments, the present invention is not restricted to this but is also applicable to a case of performing a refresh operation every prescribed memory cell arranged on an intersectional position between a prescribed word line WL and a prescribed bit line BL. While the ferroelectric memory performs the internal access operation every prescribed memory cell arranged on the intersectional position between the selected word line WL and the corresponding bit line BL in each of the aforementioned first and second embodiments, the present invention is not restricted to this but is also applicable to a case of collectively performing an internal access operation on all memory cells linked to the selected word line WL.

While each of the aforementioned first and second embodiments is applied to the simple matrix ferroelectric memory having the memory cells formed by the word lines WL, the bit lines BL and the ferroelectric films arranged between the word lines WL and the bit lines BL, the present invention is not restricted to this but is also applicable to a one-transistor ferroelectric memory causing disturbance. The present invention is further applicable to a memory, such as a DRAM requiring refreshment, other than the ferroelectric memory.

While the ferroelectric memory performs the internal access operation and the refresh operation on the basis of the cycle of the same internal clock ICLK in each of the aforementioned first and second embodiments, the present invention is not restricted to this but the memory may alternatively perform an internal access operation and a refresh operation on the basis of the cycles of different internal clocks respectively. In this case, the memory is preferably so formed as to perform a refresh operation during the period of a next external access operation when the period of the external access operation is longer than the sum of the cycles of the internal clock for the internal access operation and that for the refresh operation.

What is claimed is:

1. A memory comprising:
    an external access detection portion detecting an external access operation;
    an access control portion performing an internal access operation on the basis of said external access operation; and
    a refresh determination portion determining whether or not to perform a refresh operation on the basis of detection of said external access operation by said external access detection portion and the operating state of said access control portion, wherein said access control portion performs said refresh operation before or after said internal access operation on the basis of the result of determination of said refresh determination portion.

2. The memory according to claim 1, wherein
said refresh determination portion outputs a signal for performing said refresh operation if said access control portion performs neither said internal access operation nor said refresh operation when said external access detection portion detects said external access operation.

3. The memory according to claim 1, wherein
said access control portion performs said internal access operation after completion of said refresh operation if performing said refresh operation when said external access detection portion detects said external access operation.

4. The memory according to claim 1, wherein
said access control portion performs said internal access operation after completion of precedent said internal access operation if performing said precedent internal access operation when said external access detection portion detects said external access operation.

5. The memory according to claim 1, wherein
said access control portion performs said internal access operation and thereafter performs no said refresh operation after completion of said internal operation or said refresh operation if performing either said internal access operation or said refresh operation when said external access detection portion detects said external access operation.

6. The memory according to claim 1, wherein
the period of said internal access operation is shorter than the period of said external access operation.

7. The memory according to claim 1, further comprising an external access counting portion counting the access frequency of said external access operation, wherein
said access control portion performs said refresh operation on the basis of the result of determination of said refresh determination portion and the access frequency counted by said external access counting portion.

8. The memory according to claim 1, wherein
said internal access operation includes a data read operation and a data rewrite operation as well as a data write operation, and
said refresh operation includes a data read operation and a data rewrite operation.

9. The memory according to claim 1, further comprising:
a word line and a bit line arranged to intersect with each other, and
a memory cell arranged to be linked to at least said word line, wherein
said access control portion collectively performs said refresh operation every said word line on said memory cell linked to said word line.

10. The memory according to claim 1, further comprising:
a word line and a bit line arranged to intersect with each other, and
a ferroelectric capacitor arranged between said word line and said bit line.

11. The memory according to claim 1, further comprising a switching portion switching a row address signal corresponding to an internal address signal for performing said internal access operation and another row address signal corresponding to a refresh address signal for performing said refresh operation.

12. The memory according to claim 2, wherein
said access control portion performs said internal access operation and thereafter continuously performs said refresh operation on the basis of said signal for performing said refresh operation if performing neither said internal access operation nor said refresh operation when said external access detection portion detects said external access operation.

13. The memory according to claim 6, wherein
said access control portion includes a clock generation portion generating an internal clock having a cycle shorter than the period of said external access operation, for performing each of said internal access operation and said refresh operation in one cycle of said internal clock.

14. The memory according to claim 13, wherein
said external access operation is non-cyclically performed,
said internal clock includes an internal clock for said internal access operation and an internal clock for said refresh operation, and
said access control portion performs said refresh operation in the period of next said external access operation if the period of said external access operation is not less than the sum of the cycle of said internal clock for said internal access operation and the cycle of said internal clock for said refresh operation.

15. The memory according to claim 13, wherein
said external access operation is cyclically performed,
said internal clock includes an internal clock for said internal access operation and an internal clock for said refresh operation, and
the period of said external access operation is shorter than the sum of the cycle of said internal clock for said internal access operation and the cycle of said internal clock for said refresh operation.

16. The memory according to claim 15, wherein
said access control portion performs said refresh operation once every plurality of times of said internal access operation.

* * * * *